(12) United States Patent
Kim

(10) Patent No.: US 6,421,797 B1
(45) Date of Patent: Jul. 16, 2002

(54) INTEGRATED CIRCUIT MEMORY DEVICES AND METHODS FOR GENERATING MULTIPLE PARALLEL BIT MEMORY TEST RESULTS PER CLOCK CYCLE

(75) Inventor: Nam-Jong Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/315,255

(22) Filed: May 20, 1999

(30) Foreign Application Priority Data

May 28, 1998 (KR) .......................................... 98-19585

(51) Int. Cl.$^7$ ............................................. G11C 29/00
(52) U.S. Cl. ...................................................... 714/718
(58) Field of Search ................................ 714/718, 757, 714/719; 365/201

(56) References Cited

U.S. PATENT DOCUMENTS

| 5,214,655 A | * | 5/1993 | Eichelberger et al. ...... 714/733 |
| 5,301,142 A | * | 4/1994 | Suzuki et al. ................. 365/51 |
| 5,996,097 A | * | 11/1999 | Evans et al. |
| 6,064,601 A | * | 6/2000 | Yoo et al. ............... 365/189.04 |

FOREIGN PATENT DOCUMENTS

GB 2235555 3/1991
GB 2266381 10/1993

* cited by examiner

*Primary Examiner*—Phung M. Chung
(74) *Attorney, Agent, or Firm*—Myers Bigel Sibley & Sajovec

(57) ABSTRACT

Integrated circuit memory devices that can generate and output multiple parallel bit test results include a memory cell array and a parallel bit test circuit that is responsive to a first clock signal and is used to test the memory cell array. The parallel bit test circuit receives a plurality of data sets from the memory cell array and generates a test result for each data set. These test results are output during non-overlapping portions of a time interval that has a duration equivalent to the first clock signal period. In an illustrative embodiment, the parallel bit test circuit includes a pair of comparison circuits and a pair of latch circuits. In addition, the integrated circuit memory devices further include a clock generator that produces a pair of complementary clock signals (ie., second and third clock signals) in response to the first clock signal. The second clock signal is responsive to a rising edge of the first clock signal while the third clock signal is responsive to a failing edge of the first clock signal. Test results held in the latch circuits are output to the exterior through first and second output buffers where the first output buffer is responsive to the second clock signal while the second output buffer is responsive to the third clock signal. Accordingly, the output of one test result does not interfere with the output of another test result.

25 Claims, 3 Drawing Sheets ated circuit memory devices that can per-
form a parallel bit test on a memory cell array.

INTEGRATED CIRCUIT MEMORY DEVICES AND METHODS FOR GENERATING MULTIPLE PARALLEL BIT MEMORY TEST RESULTS PER CLOCK CYCLE

RELATED APPLICATION

This application claims the benefit of Korean Patent Application No. 98-19585, filed May 28, 1998, the disclosure of which is hereby incorporated herein by reference.

FIELD OF THE INVENTION

The present invention relates to the field of integrated circuit memories, and, more particularly, to test circuits that can reduce the time needed to test an integrated circuit memory.

BACKGROUND OF THE INVENTION

Integrated circuit memory devices are routinely tested by writing a test pattern of bits into particular memory locations and then reading the test pattern out to verify that the test pattern written into the memory and the test pattern read out of the memory are consistent. To improve the efficiency of the testing operation, many memory devices have a parallel bit test mode in which a plurality of bits are tested simultaneously, thereby shortening the test time at both a wafer level and a package level. More specifically, N-bits of data are read in a parallel bit test to determine if the data are consistent with the data previously written into the same storage cells. Typically, the test will generate a logic "1" or "0" corresponding to a "matched" or "unmatched" result, respectively. Those memory locations that produce an unmatched result can be repaired through the use of well known redundancy schemes.

Parallel bit testing can significantly reduce testing time even in integrated circuit memories in which the column width is a single bit (e.g., memories with a x1 bit architecture). The number of testing cycles needed to test a semiconductor memory device one bit at a time can be reduced by a factor of 1/N if parallel bit testing is used. Moreover, for memory devices that have several input/output (I/O) lines for testing multiple bits in parallel, the testing efficiency can nevertheless be further improved by using each I/O line to report parallel bit test results.

As the degree of integration of memory devices is increased, however, the number of bits to be simultaneously tested in a parallel bit test also needs to increase to minimize any increase in test time. For example, a 16-bit parallel bit test is typically used in 16M dynamic random access memories (DRAMs) while a 32-bit parallel bit test is typically used 64M DRAMs.

Unfortunately, because device integration is increasing at a more rapid rate than parallel bit test width is increasing, the additional time spent in testing will typically translate into increased manufacturing costs as conventional parallel bit testing fails to keep up with more highly integrated memory devices. Consequently, there exists a need for an improved parallel bit testing system that further reduces the time needed to test an integrated circuit memory device and thereby reduces testing costs.

SUMMARY OF THE INVENTION

Certain objects, advantages, and features of the invention will be set forth in the description that follows and will become apparent to those skilled in the art upon examination of the following or may be learned with the practice of the invention.

It is an object of the present invention to provide improved integrated circuit memory devices that can perform a parallel bit test on a memory cell array.

It is a further object of the present invention to allow multiple parallel bit test results to be transferred to an output during a time interval that is equivalent to a single clock cycle period.

To achieve the advantages and features, the present invention is generally directed to integrated circuit memory devices and methods that can generate and output multiple parallel bit test results during a time interval equal to a period of a single clock cycle. More specifically, the integrated circuit memory devices include a memory cell array and a parallel bit test circuit that is responsive to a first clock signal and is used to test the memory cell array. The parallel bit test circuit receives a plurality of data sets from the memory cell array and generates a test result for each data set. These test results are output during non-overlapping portions of a time interval that has a duration equivalent to the first clock signal period. Accordingly, the output of one test result does not interfere with the output of another test result.

In an illustrative embodiment of the invention, the parallel bit test circuit includes a pair of comparison circuits and a pair of latch circuits. In addition, the integrated circuit memory devices further include a clock generator that produces a pair of complementary clock signals (i.e., second and third clock signals) in response to the first clock signal. The second clock signal is responsive to a rising edge of the first clock signal while the third clock signal is responsive to a falling edge of the first clock signal. Test results held in the latch circuits are output to the exterior through first and second output buffers where the first output buffer is responsive to the second clock signal while the second output buffer is responsive to the third clock signal. As a result, multiple test results can be transferred to the exterior during a time interval equivalent to the duration of a single cycle of the first clock signal.

The invention can also be viewed as providing a method for performing a parallel bit test on an integrated circuit memory device wherein multiple parallel bit test results are generated and output during a time interval equal to a period of a single clock cycle. In this regard, the method can be broadly summarized by the following steps: A plurality of data sets from a memory cell array are tested and a test result is generated for each data set. These test results are transferred to an output of the integrated circuit memory device in response to a first clock signal. In particular, each test result is transferred during non-overlapping portions of a time interval that has a duration equivalent to the first clock signal period. Accordingly, the output of one test result does not interfere with the output of another test result.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
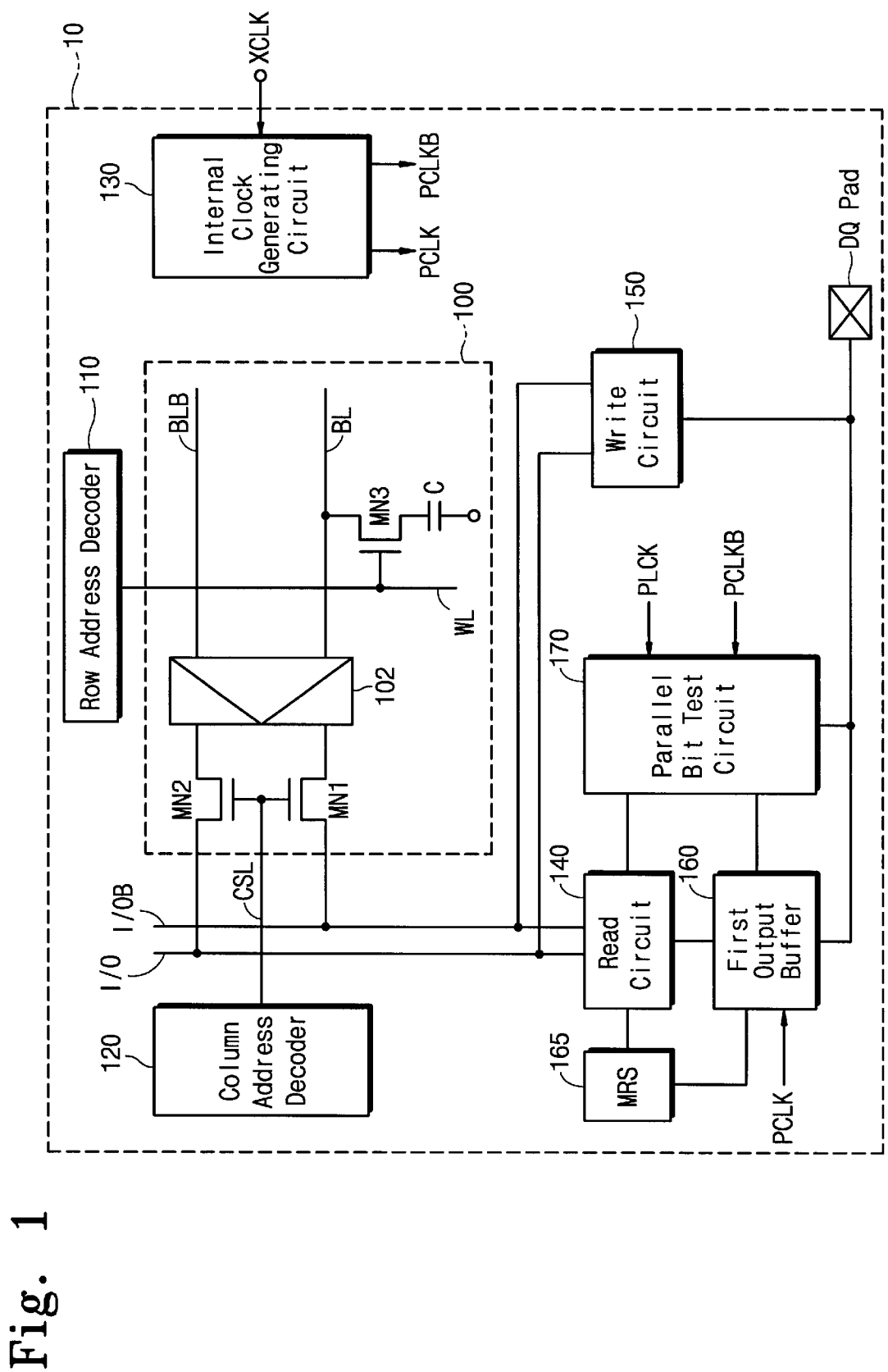
FIG. 1 is a block diagram of a semiconductor memory device incorporating a parallel bit testing circuit in accordance with the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

An integrated circuit memory device 10 having a parallel bit testing capability in accordance with the principles of the present invention is shown in FIG. 1. The integrated circuit memory device 10 is exemplary of a DRAM device and comprises a memory cell array 100 connected to row and column decoders 110 and 120. For purposes of illustration, a single storage cell in the memory cell array 100 is depicted and will be described hereafter.

The memory cell array 100 comprises complementary input/output lines I/O and I/OB and a sense amplifier 102. Two NMOS transistors MN1 and MN2 are configured as pass transistors such that their drain electrodes are connected to the sense amplifier 102 and their source electrodes are attached to the I/OB and I/O lines, respectively. Sense amplifier 102 amplifies a potential difference between bit lines BL and BLB, which is provided on the input/output lines through transistors MN1 and MN2. A third NMOS transistor MN3 (i.e., cell access transistor) has its source electrode coupled to the sense amplifier 102 through bit line BL and a drain electrode coupled to a storage capacitor C. The transistor MN3 and capacitor C form a single storage cell in the memory cell array 100. The gate of transistor MN3 is controlled by the row address decoder 110 through the word line WL. Transistors MN1 and MN2 have their gates connected together and are controlled by the column address decoder 120 through a column selection line (CSL).

Figure 2:
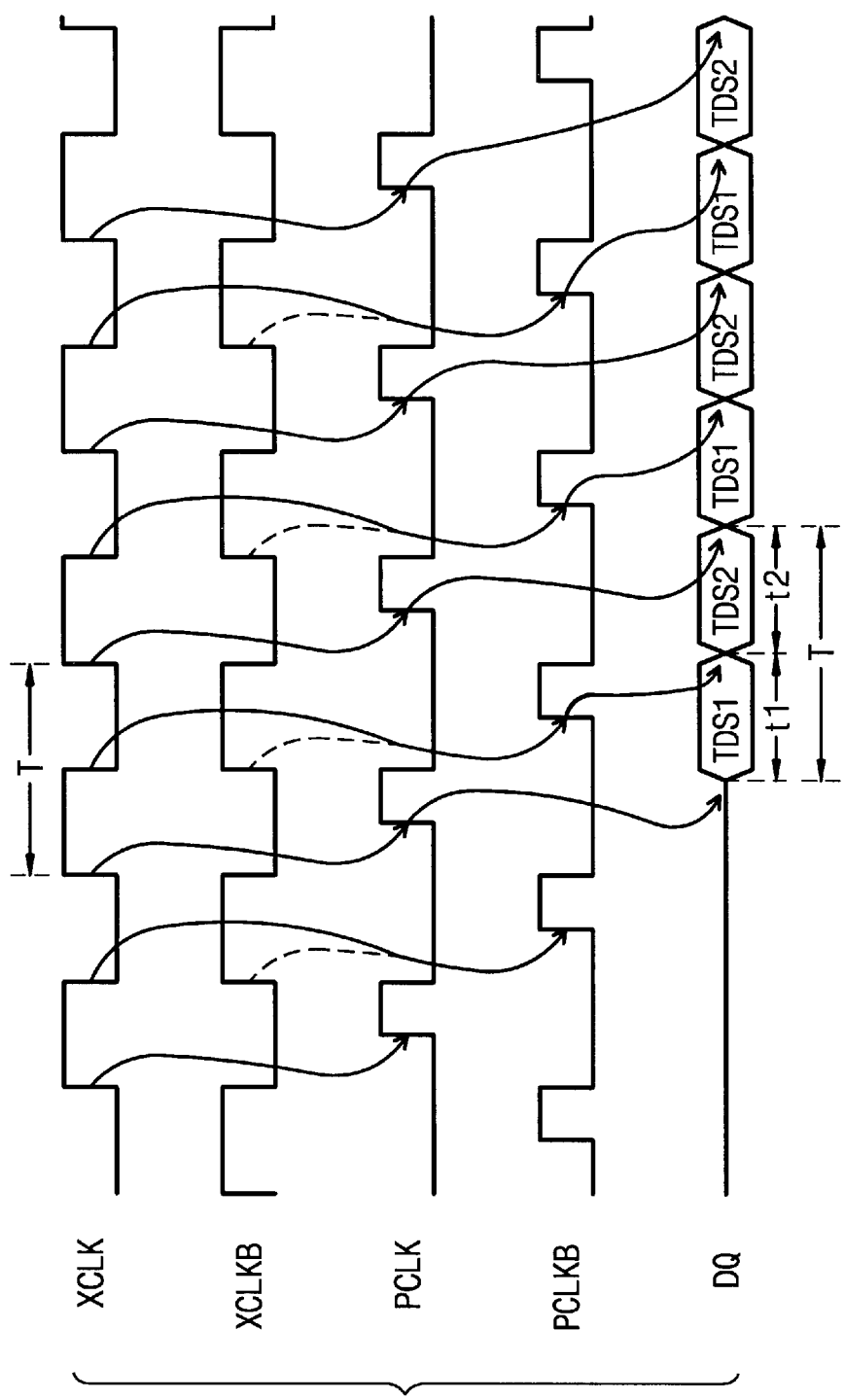
FIG. 2 is a timing diagram that illustrates the clock signals used by the semiconductor memory device of FIG. 1.

As shown in FIG. 1, the integrated circuit memory device 10 further comprises an internal clock generating circuit 130, which generates a first internal clock signal PCLK and a second internal clock signal PCLKB in response to an externally applied clock signal XCLK. With reference to FIG. 2, the first internal clock signal PCLK is produced in response to a rising edge of the external clock signal XCLK, and the second internal clock signal PCLKB is produced in response to a falling edge of the external clock signal XCLK. Alternatively, the internal clock generating circuit 130 could receive both the external clock signal XCLK and a second external clock signal XCLKB, which is complementary to the signal XCLK. The internal clock generating circuit 130 then generates the first internal clock signal PCLK in response to a rising edge of the signal XCLK and the second internal clock signal PCLKB in response to a rising edge of the signal XCLKB. Using a single external clock signal XCLK is generally preferred to obviate the need to generate the complementary signal XCLKB outside of the integrated circuit memory device 10.

A read circuit 140 for reading out data and a write circuit 150 for writing in data are connected to memory cell array 100 through input/output lines I/O and I/OB. A first output buffer 160 is connected to the read circuit 140 and is used to output data from the read circuit 140 to the exterior through a DQ pad or pin. For testing the memory cell array 100, a parallel bit test circuit 170 is connected to both the read circuit 140 and the first output buffer 160. During a parallel bit test, data from the read circuit 140 is supplied to the parallel bit test circuit 170. The first output buffer 160 receives and outputs data from the parallel bit testing circuit 170, instead of from the read circuit 140, in response to the first internal clock signal PCLK. The switching function between parallel bit test mode and normal operation is handled through a mode register set device (MRS) 165 connected to both the read circuit 140 and first output buffer 160.

As stated hereinbefore, FIG. 1 depicts memory cell array 100 as a single storage cell for purposes of illustration. It should be understood, however, that the memory cell array 100 comprises many such storage cells and many input/output line pairs, I/O and I/OB, which are accessed by the read circuit 140 and the write circuit 150.

Figure 3:
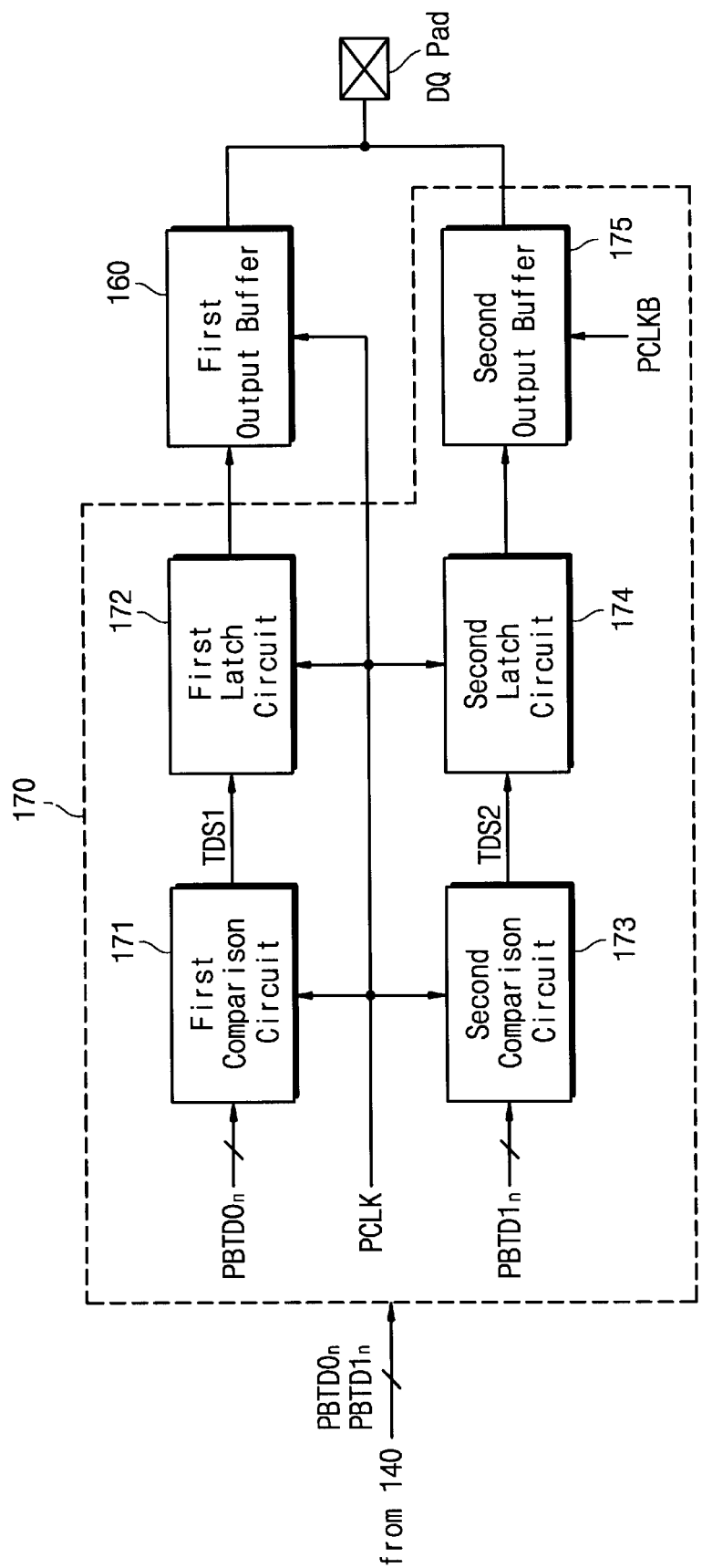
FIG. 3 is a block diagram of the parallel bit testing circuit of FIG. 1.

A preferred embodiment of the parallel bit test circuit 170 in accordance with the present invention is shown in FIG. 3. The parallel bit test circuit 170 comprises first and second comparison circuits 171 and 173, each comprising an N-bit comparator having N inputs and a single output. The output lines from the first and second comparison circuits 171 and 173 are connected to the input lines of the first and second latch circuits 172 and 174, respectively. The first and second latch circuits 172 and 174 each comprise a pair of latched inverters and are arranged such that an output of the first latch circuit 172 is coupled to an input of the first output buffer 160, and an output of the second latch circuit 174 is coupled to an input of the second output buffer 175. Both the first and second output buffers 160 and 175 have their outputs connected to the DQ pad for delivering data to the exterior. The first and second comparison circuits 171 and 173, first and second latch circuits 172 and 174, and first output buffer 160 are all responsive to the first internal clock signal PCLK. Conversely, the second output buffer 175 is responsive to the second internal clock signal PCLKB.

The operation of the parallel bit test circuit 170 is described hereafter with reference to FIG. 3 and the timing diagram of FIG. 2.

It is assumed that the integrated circuit memory device 10 is designed so that N sense amplifiers, which are connected to NMOS transistors MN1 and MN2, are simultaneously enabled when the CSL connected to transistors MN1 and MN2 is selected. During normal operation, N-bits of data are amplified and output onto the input/output lines I/O and I/OB upon selection of a particular set of CSLs. The N-bits of data are then received by the read circuit 140 and output to the DQ pad through the first output buffer 160 as discussed hereinbefore. When the integrated circuit memory device 10 is placed in parallel bit test mode, however, two sets of CSLs are selected at the same time causing two sets of N-bit data, PBTD0n and PBTD1n, to be simultaneously provided to the parallel bit test circuit 170 through the read circuit 140.

The first comparison circuit 171 receives the first data set PBTD0n in response to the first internal clock signal PCLK, and then detects whether all of the N-bits of data associated with the set are at an equivalent logic state (i.e., a logic "0" or a logic "1"). After making this determination, the first comparison circuit 171 generates a first test data signal TDS1 at either a low or a high logic level to represent the test result. Similarly, the second comparison circuit 173 receives the second data set PBTD1n in response to the first internal clock signal PCLK, and then detects whether all of the N-bits of data associated with the set are at an equivalent logic state. After making this determination, the second comparison circuit 173 generates a second test data signal TDS2 at either a low or a high logic level to represent the test result.

The first and second test data signals TDS1 and TDS2 are then latched by the first and second latch circuits 172 and 174, respectively, in response to the first internal clock signal PCLK. As shown in FIG. 2, the first test data signal TDS1 is output to the exterior through the first output buffer 160 and the DQ pad in synchronization with the first internal clock signal PCLK. That is, the first test data signal TDS1 is output during a first portion $t_1$ of a time interval T corresponding to the period of a single cycle of the external clock XCLK. The second test data signal TDS2 is output to the exterior through the second output buffer 175 and the DQ pad in synchronization with the second internal clock signal PCLKB. Because the second internal clock signal PCLKB is synchronized with the falling edge of the external clock signal XCLK and the first internal clock signal PCLK is synchronized with the rising edge of the external clock signal XCLK, the second test data signal TDS2 can be output to the exterior during a second portion $t_2$ of the time interval T that does not overlap with the first portion $t_1$. Thus, the second test data signal TDS2 can be output to the exterior without interfering with the output of the first test data signal TDS1.

As described herein, two parallel bit test data signals TDS1 and TDS2 can be transferred through a single DQ pad to the exterior during a time interval T that is equal to the period of a single cycle of an external clock signal XCLK. Advantageously, the frequency with which parallel bit test data is provided to the exterior is doubled, which reduces by half the time required to test all data stored in the memory cell array 100. It therefore follows that a corresponding reduction in testing cost can also be achieved.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

I claim:

1. An integrated circuit memory device, comprising:
  a memory cell array; and
  a parallel bit test circuit that is responsive to a first clock signal and performs first and second tests on first and second sets of data read from the memory cell array, respectively, and based on the first and second tests outputs first and second test results during first and second non-overlapping portions of a time interval having a duration equal to a period of the first clock signal, respectively.

2. A memory device as recited in claim 1, wherein the parallel bit test circuit comprises:
  a first comparison circuit that receives the first set of data and generates the first test result in response thereto, the first test result being at a first logic state when all of the first set of data are the same; and
  a second comparison circuit that receives the second set of data and generates the second test result in response thereto, the second test result being at the first logic state when all of the second set of data are the same.

3. A memory device as recited in claim 2, wherein the parallel bit test circuit further comprises:
  a first latch circuit that receives the first test result from the first comparison circuit; and
  a second latch circuit that receives the second test result from the second comparison circuit.

4. A memory device as recited in claim 3, further comprising:
  a clock generator responsive to the first clock signal that produces a second clock signal and a third clock signal, the second clock signal being complementary to the third clock signal.

5. A memory device as recited in claim 4, wherein the second clock signal is responsive to a rising edge of the first clock signal and the third clock signal is responsive to a falling edge of the first clock signal.

6. A memory device as recited in claim 5, further comprising:
  a first output buffer responsive to the second clock signal that couples the first latch circuit to the output; and
  a second output buffer responsive to the third clock signal that couples the second latch circuit to the output.

7. A memory device as recited in claim 6, further comprising:
  a read circuit that reads the first and second sets of data from the memory cell array, the read circuit being coupled to the first and second comparison circuits and the first output buffer.

8. A memory device as recited in claim 7, further comprising:
  a mode register set device coupled to the read circuit and the first output buffer, the mode register set device having a plurality of states such that when the mode register set is in a first state, the first output buffer receives data from the first latch circuit.

9. A method of performing a parallel bit test on an integrated circuit memory device, comprising the steps of:
  testing a first and a second set of data from a memory cell array to generate a first and a second test result corresponding to the first and second sets of data respectively; and
  transferring the first and second test results to an output in response to a first clock signal such that the first test result and the second test result are transferred during first and second non-overlapping portions of a time interval having a duration equal to a period of the first clock signal, respectively.

10. A method as recited in claim 9, wherein the testing step comprises the steps of:
  if all of the first set of data are the same, then setting the first test result to a first logic state; and
  if all of the second set of data are the same, then setting the second test result to the first logic state.

11. A method as recited in claim 9, further comprising the steps of:
  deriving a second clock signal from the first clock signal; and
  deriving a third clock signal from the first clock signal, the second clock signal being complementary to the third clock signal.

12. A method as recited in claim 11, wherein the second clock signal is responsive to a rising edge of the first clock signal and the third clock signal is responsive to a falling edge of the first clock signal.

13. A method as recited in claim 12, wherein the transferring step comprises the steps of:
  moving the first test result to the output in response to the second clock signal; and
  moving the second test result to the output in response to the third clock signal.

14. An integrated circuit memory device, comprising:
  a memory cell array;
  a clock generator responsive to an external clock signal that produces a first internal clock signal and a second internal clock signal;

a parallel bit test circuit that is responsive to the first internal clock signal and performs first and second tests on first and second sets of data read from the memory cell array, respectively, and based on the first and second tests outputs first and second test results during first and second non-overlapping portions of a time interval having a duration equal to a period of the external clock signal, respectively.

15. A memory device as recited in claim 14, wherein the parallel bit test circuit comprises:

a first comparison circuit that receives the first set of data and generates the first test result in response thereto, the first test result being at a first logic state when all of the first set of data are the same; and a second comparison circuit that receives the second set of data and generates the second test result in response thereto, the second test result being at the first logic state when all of the second set of data are the same.

16. A memory device as recited in claim 15, wherein the parallel bit test circuit further comprises:

a first latch circuit that receives the first test result from the first comparison circuit; and a second latch circuit that receives the second test result from the second comparison circuit.

17. A memory device as recited in claim 15, wherein the first internal clock signal is responsive to a rising edge of the external clock signal and the second internal clock signal is responsive to a falling edge of the external clock signal.

18. A memory device as recited in claim 17, further comprising:

a first output buffer responsive to the first internal clock signal that couples the first latch circuit to the output; and a second output buffer responsive to the second internal clock signal that couples the second latch circuit to the output.

19. A memory device as recited in claim 18, further comprising:

a read circuit that reads the first and second sets of data from the memory cell array, the read circuit being coupled to the first and second comparison circuits and the first output buffer.

20. A memory device as recited in claim 19, further comprising:

a mode register set device coupled to the read circuit and the first output buffer such that the first output buffer receives data from the first latch circuit when the mode register set device is in a test mode.

21. A method of performing a parallel bit test on an integrated circuit memory device, comprising the steps of:

testing a first and a second set of data from a memory cell array to generate a first and a second test result corresponding to the first and second sets of data respectively; and transferring the first and second test results to an output in response to an external clock signal such that the first test result and the second test result are transferred during first and second non-overlapping portions of a time interval having a duration equal to a period of the external clock signal, respectively.

22. A method as recited in claim 21, wherein the testing step comprises the steps of:

if all of the first set of data are the same, then setting the first test result to a first logic state; and if all of the second set of data are the same, then setting the second test result to the first logic state.

23. A method as recited in claim 21, further comprising the steps of:

deriving a first internal clock signal from the external clock signal; and deriving a second internal clock signal from the external clock signal.

24. A method as recited in claim 23, wherein the first internal clock signal is responsive to a rising edge of the external clock signal and the second internal clock signal is responsive to a falling edge of the external clock signal.

25. A method as recited in claim 24, wherein the transferring step comprises the steps of:

moving the first test result to the output in response to the first internal clock signal; and moving the second test result to the output in response to the second internal clock signal.

* * * * *

UNITED STATES PATENT AND TRADEMARK OFFICE
CERTIFICATE OF CORRECTION

PATENT NO. : 6,421,797 B1
DATED : July 16, 2002
INVENTOR(S) : Kim

It is certified that error appears in the above-identified patent and that said Letters Patent is hereby corrected as shown below:

<u>Title page,</u>
Item [57], ABSTRACT,
Line 17, please change "failing" to -- falling --.

Signed and Sealed this

Sixth Day of September, 2005

JON W. DUDAS
*Director of the United States Patent and Trademark Office*